United States Patent
Kim

(10) Patent No.: US 7,852,654 B2
(45) Date of Patent: Dec. 14, 2010

(54) SEMICONDUCTOR MEMORY DEVICE, AND MULTI-CHIP PACKAGE AND METHOD OF OPERATING THE SAME

(75) Inventor: You Sung Kim, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 109 days.

(21) Appl. No.: 11/958,377

(22) Filed: Dec. 17, 2007

(65) Prior Publication Data

US 2008/0159012 A1 Jul. 3, 2008

(30) Foreign Application Priority Data

Dec. 28, 2006 (KR) .................. 10-2006-0136373
Nov. 12, 2007 (KR) .................. 10-2007-0115053

(51) Int. Cl.
*G11C 5/00* (2006.01)
*G11C 5/02* (2006.01)
*G11C 16/04* (2006.01)

(52) U.S. Cl. .................. 365/52; 365/51; 365/185.03; 365/185.11

See application file for complete search history.

(58) Field of Classification Search .................. 365/52

(56) References Cited

U.S. PATENT DOCUMENTS

| | | | | |
|---|---|---|---|---|
| 6,944,093 | B2 * | 9/2005 | Sumitani | 365/235 |
| 7,568,135 | B2 * | 7/2009 | Cornwell et al. | 714/721 |
| 7,570,515 | B2 * | 8/2009 | Katayama et al. | 365/185.03 |
| 2006/0075183 | A1 * | 4/2006 | Lin et al. | 711/103 |
| 2007/0156949 | A1 * | 7/2007 | Rudelic et al. | 711/103 |
| 2008/0037321 | A1 * | 2/2008 | Luo et al. | 365/185.03 |
| 2008/0059835 | A1 * | 3/2008 | Yoon | 714/6 |
| 2008/0209108 | A1 * | 8/2008 | Pyeon et al. | 711/103 |

FOREIGN PATENT DOCUMENTS

| | | |
|---|---|---|
| JP | 2001-006374 | 1/2001 |
| KR | 100205240 B1 | 4/1999 |
| KR | 1020010055780 A | 7/2001 |
| KR | 1020050067523 A | 7/2005 |

* cited by examiner

*Primary Examiner*—Son L Mai
(74) *Attorney, Agent, or Firm*—Townsend and Townsend and Crew LLP

(57) ABSTRACT

The present invention relates to a semiconductor device including a MLC capable of storing plural bits of data, wherein some of the MLC are set and operated as a buffer section in response to a control signal.

8 Claims, 3 Drawing Sheets

SEMICONDUCTOR MEMORY DEVICE, AND MULTI-CHIP PACKAGE AND METHOD OF OPERATING THE SAME

CROSS-REFERENCE TO RELATED APPLICATIONS

This application claims priority from Korean Patent Application No. 2006-136373, filed on Dec. 28, 2006, and Korean Patent Application No. 2007-115053, filed on Nov. 12, 2007, the contents of which are incorporated herein by reference in its entirety.

BACKGROUND OF THE INVENTION

The present invention relates to a semiconductor memory device, and more particularly, to a semiconductor memory device and a multi-chip package including at least one memory chip having a Multi-Level Cell (MLC) for storing plural bits of data.

Recently, electronic devices are much smaller and lighter in accordance with the development of a semiconductor industry and the requirement of a user. One of the techniques for making the electronic devices smaller is a multi-chip packaging technique.

The multi-chip packaging technique means a technique for packaging a plurality of semiconductor chips into one package. Here, a method of using the multi-chip package has more advantages than a method of using a plurality of packages respectively having one semiconductor in view of miniaturization, light weight and packaging area.

In addition, a memory device has been rapidly integrated. A memory device having a MLC for storing 2-bit or more data has been developed as one of these integration methods. Here, the MLC has multi-levels. Further, a multi-chip package having a plurality of MLC memory chips has been developed.

On the other hand, in an operation of a common flash memory device, a read time and a program time affects the performance of the memory device. Specially, in the case of the MLC, it is need to separate a read operation and a program operation of each of the bits in a unit cell. Additionally, the program time and the read time are increased accordingly as the number of bits is augmented.

Accordingly, the speed of a MLC flash memory device having a MLC for storing 3-bit or more data is rapidly deteriorated. As a result, the operation of a multi-chip package having at least one MLC memory chip is limited due to data throughput.

SUMMARY OF THE INVENTION

The present invention is directed towards a semiconductor memory device and a multi-chip package with enhanced memory efficiency by improving the operation speed of a multi-chip package including MLC chips capable of storing plural bits, and a method of operating the same.

In an aspect, a semiconductor memory device includes MLC capable of storing plural bits of data, wherein part of the MLC is set and operated as a buffer section in response to a control signal.

In another aspect, a multi-chip package device includes a plurality of memory devices respectively including a MLC, wherein some of the memory devices are set and operated as buffer sections in response to a control signal.

Each of the plurality of memory devices may include the buffer section set in response to the control signal of the controller and configured to temporarily store program data, and a MLC array section comprising the MLCs in which data stored in the buffer section are stored in response to the control signal of the controller and plural bits are stored.

The buffer section may operate as a Single Level Cell (SLC) or a MLC for storing 2-bit data. The MLC cell array section may store 3-bit data or more.

The controller may control input data to be temporarily stored in the buffer section and control the data of the buffer section to be stored in the MLC array section. The controller may include storage means for temporarily storing data. Input data exceeding a capacity of the buffer section are stored in the storage means of the controller. The data stored in the storage means of the controller may be primarily stored in the MLC array section.

The controller may control the data, stored in the buffer section, to be moved to the storage means of the controller and control the data, moved to the storage means of the controller, to be stored in the MLC section.

In still another aspect, a multi-chip package device includes one or more buffer memory chips comprising a SLC or MLCs, one or more memory chips comprising the MLCs, and a controller for controlling program data to be stored in the buffer memory chips and the data stored in the buffer memory chips to be moved to and stored in the memory chips.

In further still another aspect, a data programming method of a multi-chip package device comprising at least one memory chip including a MLC capable of storing plural bits of data includes defining a first area of the memory chip to be a buffer area, storing input data in the set buffer area in response to a program command, and moving the data stored in the buffer area to a second area of the memory chip and programming the moved data into the second area of the memory chip.

The defining of the first area may include defining the first area of the memory chip to be a SLC. The defining of the first area may include defining the first area of the memory chip to be a 2-bit MLC. The data stored in the buffer area may be moved to the second area when the multi-chip package device does not operate for a specific period of time.

In further still another aspect, a data programming method of a multi-chip package device comprising at least one memory chip including a MLC capable of storing plural bits of data includes defining a first area of the memory chip to be a buffer area, storing input data in the set buffer area according to a programming command, when the input data exceeds a capacity of the set buffer area, storing the exceeded data in a buffer of a controller that controls the memory chip, when data are stored in the buffer of the controller, programming the data stored in the buffer into a second area of the memory chip, and deleting data stored in the buffer of the controller, when data are not stored in the buffer of the controller, storing the input data, stored in the set buffer area, in the buffer of the controller and deleting the buffer area, and moving the data stored in the buffer of the controller to the second area of the memory chip and programming the moved data into the second area of the memory chip.

As described above, the multi-chip package device and the method of operating the same can enhance the operation speed of the multi-chip package including memory chips respectively having a MLC for storing 3-bit or more data, thereby enhancing the efficiency of a memory device. Hence, the device and method of the present invention may be employed in various fields.

DESCRIPTION OF SPECIFIC EMBODIMENTS

Hereinafter, embodiments of the present invention will be explained in more detail with reference to the accompanying drawings.

Figure 1:
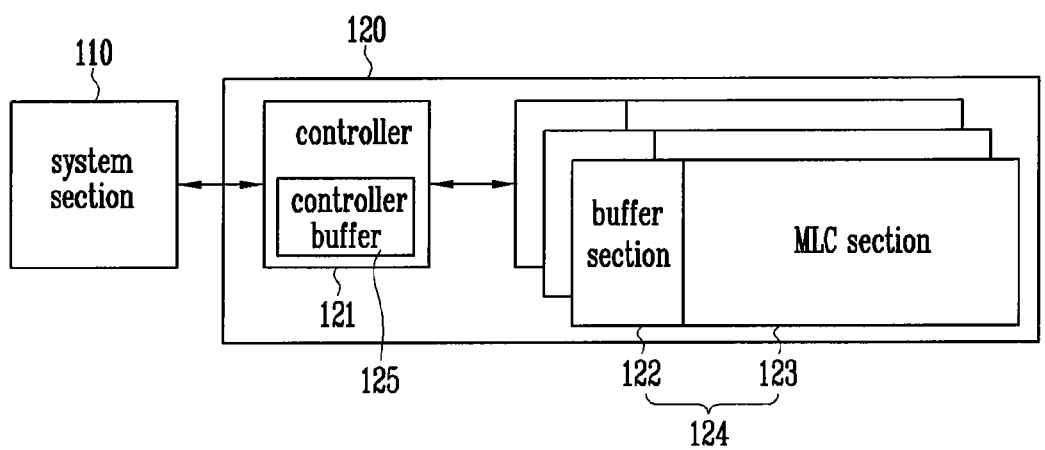
FIG. 1 is a block diagram illustrating a multi-chip package according to a first embodiment of the present invention.

Referring to FIG. 1, a multi-chip package 120 of the present embodiment includes a controller 121 and a MLC 124 for storing data of a plurality of bits under the control of the controller 121. Here, the controller 121 is coupled to a system section 110 such as a computer having a memory device, and controls input/output of data in accordance with an operation command transmitted from the system section 110.

On the other hand, FIG. 1 does not illustrate peripheral circuits for programming data to the MLC 124 or reading data from the MLC 124 under the control of the controller 121.

The MLC 124 includes memory cells having multi-levels, which uses some of the memory cells as a buffer section 122 in accordance with the control of the controller 121, and uses the other memory cells as a MLC section 123.

The buffer section 122 set by the controller 121 functions as SLCs, and the MLC section 123 is set to operate as MLCs for storing data bits.

In addition, the size of the buffer section 122 may be changed by the controller 121. Further, the memory cells set as the buffer section 122 operate as SLCs as mentioned above, or operate as the MLC for storing 2-bit data.

The controller 121 may also include a controller buffer 125. The controller buffer 125 may also temporarily store input data. If the controller buffer 125 is included in the controller 121, input data may be stored in the buffer section 122. When data exceeding the capacity of the buffer section 122 are input, the data may be temporarily stored in the controller buffer 125.

The MLC section 123 is made up of MLCs for storing 3-bit or more data.

Accordingly, the multi-chip package 120 having the above constitution temporarily stores data transmitted from the system section 110 to the buffer section 122 under the control of the controller 121 when data are programmed.

The controller 121 loads the data stored temporarily in the buffer section 122, and stores the load data in the MLC section 123.

The data stored temporarily in the buffer section 122 are transmitted to the MLC section 123 during a time when no call is occurring from the system section 110, i.e. less busy time (idle time). That is, the multi-chip package 120 may use efficiently a time corresponding to an idle state of the system 110. Since loading the data into the buffer is much faster than the MLC, loading the data into the MLC during a less busy time may increase the throughput of the data.

If, as mentioned above, the controller buffer 125 is included in the controller 121, the data temporarily stored in the controller buffer 125 are transferred to the MLC section 123 during a specific time period of no call from the system 110. The data of the buffer section 122 are read and temporarily stored in the buffer section 125 of the controller 121. At this time, the data stored in the buffer section 122 may be deleted according to a preset option. The preset option may be selected by a user. The data transferred from the buffer section 122 to the controller buffer 125 are moved and stored in the MLC section 123.

In short, the multi-chip package 120 of the first embodiment sets some of the MLC 124 as the buffer section 122, and operates the buffer section 122 as a SLC or a MLC for storing 2-bit data so as to enhance the operation velocity of the multi-chip package 120. However, the program speed of a multi-chip package may also be enhanced by using a device according to a second embodiment described below. Here, in the device of the second embodiment, a buffer section 220 is not included in the MLC 230, but exists independently from the MLC 230.

Figure 2:
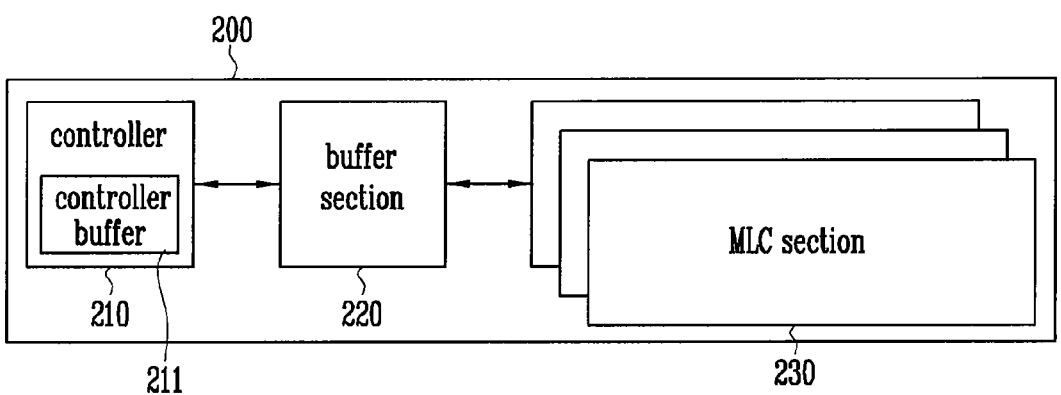
FIG. 2 is a block diagram illustrating a multi-chip package according to a second embodiment of the present invention.

In FIG. 2, the multi-chip package 200 of the present embodiment includes a controller 210, the buffer section 220 and the MLC 230.

The buffer section 220 includes a Single Level Cell (SLC) or a MLC for storing 2-bit data different from the MLC 230, and is included in a memory chip different from a MLC chip corresponding to the MLC 230. That is, the multi-chip package 200 includes a memory chip having a SLC (or a MLC for storing 2-bit data) and a MLC chip having the MLC 230 for storing 3-bit or more data.

The controller 210 controls the buffer section 220 and the MLC 230 so that data inputted thereto are temporarily stored in the buffer section 220, and then the data stored in the buffer section 220 are moved to the MLC 230. Further, the controller 210 may include a controller buffer 211 therein.

In brief, in the second embodiment unlike the first embodiment, the buffer section 220 which is made up of the SLC or the MLC for storing 2-bit data is not included in the MLC 230, but exits independently from the MLC 230. In other words, the multi-chip package 200 in the second embodiment may enhance the program speed thereof through the buffer section 220 that exists independently from the MLC 230.

Figure 3:
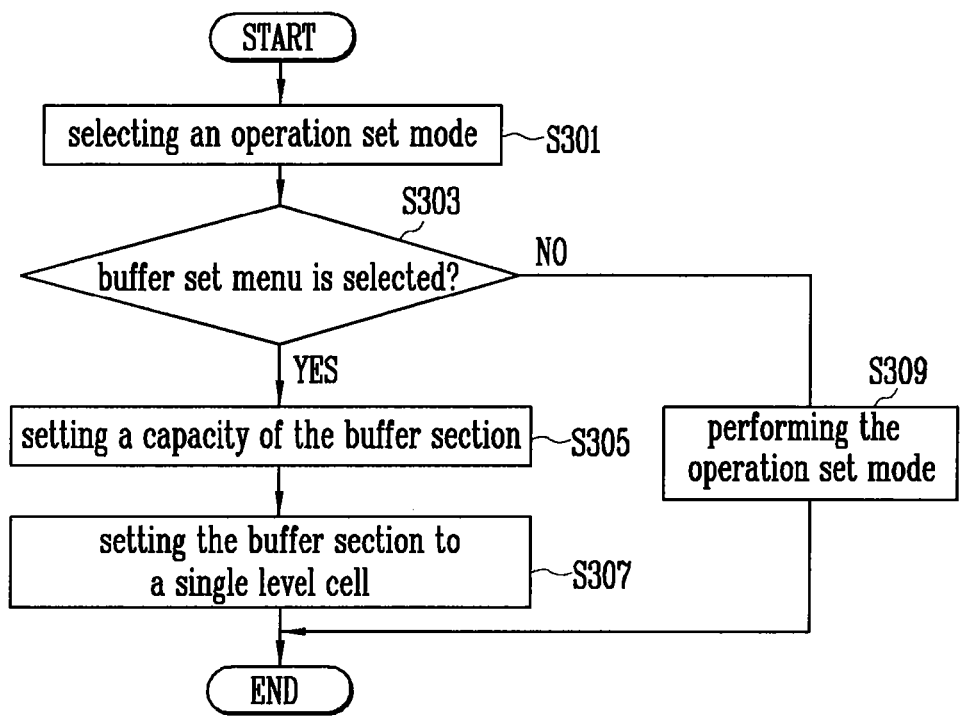
FIG. 3 is a flowchart illustrating a method of defining the buffer section in FIG. 1.

FIG. 3 is a flowchart illustrating the method of defining the buffer section in FIG. 1.

Referring to FIG. 3, in step S301, an operation set mode of the multi-chip package 120 is selected through the system section 110 so as to set the buffer section 122 of the multi-chip package 120 in FIG. 1. In this case, a menu is displayed on a display section (not shown) included in the system section 110 so that a user verifies the displayed menu. Here, an operation of the multi-chip package 120 is set by using the displayed menu under the control of the controller 121.

A user selects a buffer set menu of the displayed menu in step S303, and sets a capacity to be used as the buffer section 122 of the MLC 124 in step S305.

In step S307, though the buffer section 122 having the preset capacity is made up of the MLC, the controller 121 controls the buffer section 122 so that the buffer section 122 is operated as the SLC. Additionally, a part set as the butler section 122 of the MLC 124 may be operated as the MLC for storing 2-bit data. This is because the program speed of the SLC or the MLC for storing 2-bit data is more rapid than that of the MLC for storing 3-bit or more data. If the user does not select a buffer set up mode in step S303, the system section 110 performs an operation set mode in step S309.

Hereinafter, a program operation of the multi-chip packages 120 and 200 in the first and second embodiments will be described in detail.

Figure 4:
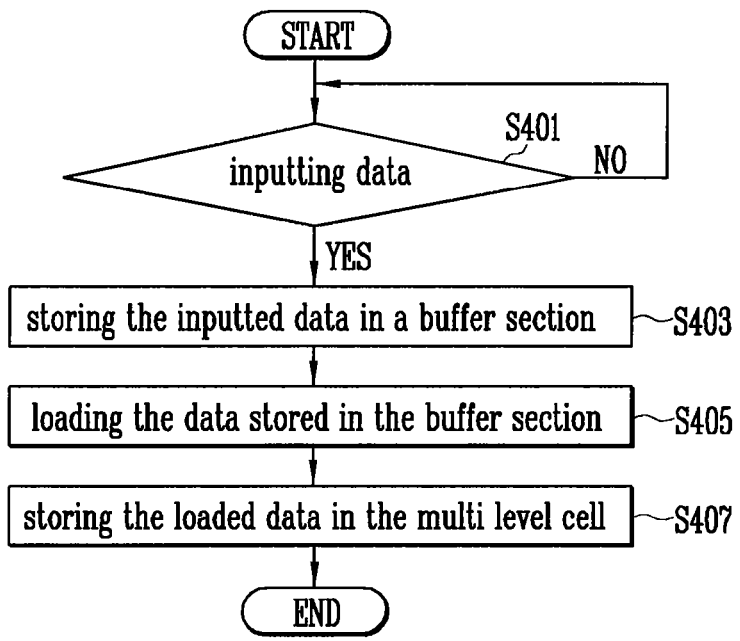
FIG. 4 is a flowchart illustrating a program operation of the multi-chip package according to the first embodiment of the present invention.

As shown in FIG. 4, in the event that data are inputted with a program command from the system section 110 in step S401, the controller 121 and 210 stores the input data in the buffer sections 122 and 220 in step S403.

A method of storing the data in the buffer sections 122 and 220 is substantially identical to that of programming data into a common SLC or a MLC for storing 2-bit data. Accordingly, the controller 121 and 210 controls peripheral circuits (not shown) to perform the program operation.

The input data in step S403 may be stored rapidly in the buffer sections 122 and 220.

In step S407, when the system section 110 has an idle state or a less busy time state, the controller 121 and 210 controls the buffer sections 122 and 220, the MLC section 123 and the MLC 230 so that the data stored in the buffer sections 122 and 220 are loaded and the loaded data are then stored in the MLC section 123 or the MLC 230.

The MLC section 123 or the MLC 230 is made up of a MLC for storing 3-bit or more data. Here, a program time required to program data into the MLC section 123 or the MLC 230 is longer than that required to program data into the buffer sections 121 and 220.

Accordingly, the input data are temporarily stored in the buffer section 121 and 220 which programs rapidly the input data, and then the stored data are programmed to the MLC during the system section 110 has idle state or less busy time state. As a result, the program time is reduced, and so the program speed of the multi-chip packages 120 and 200 is improved. In other words, the efficiency of the multi-chip package 120 and 200 is enhanced.

In an embodiment different from the first and second embodiments, to enhance the program speed, a package having a SLC or a MLC for storing 2-bit data and operates as a buffer section may be included in a system section, and a multi-chip package may be made up of a MLC for storing data of 3 bits.

Figure 5:
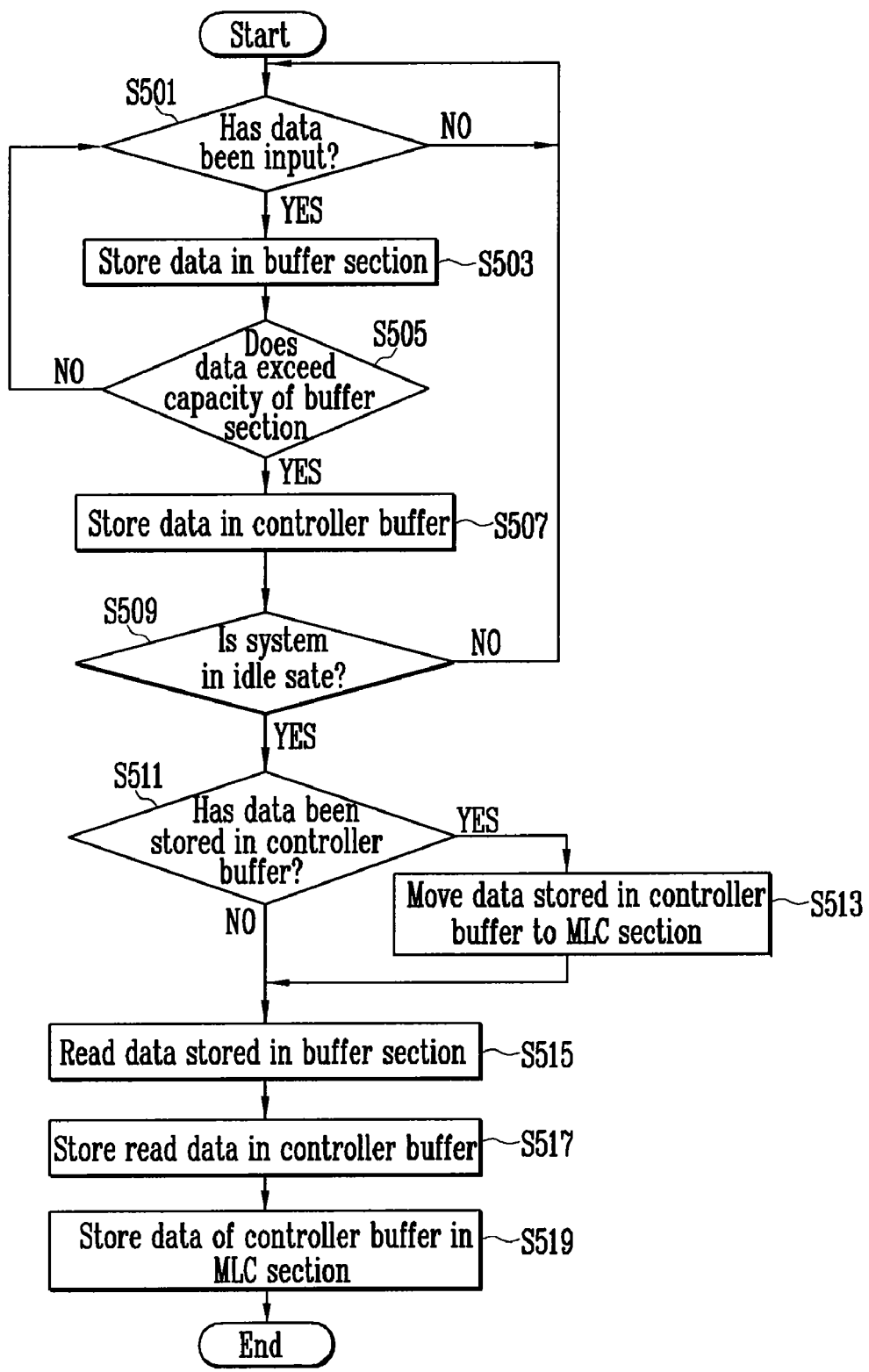
FIG. 5 is a flowchart illustrating a program operation of the multi-chip package according to the second embodiment of the present invention.

FIG. 5 is a flowchart illustrating the program operation of the multi-chip package according to a second embodiment of the present invention.

The flowchart of FIG. 5 is described with reference to FIGS. 1 and 2. FIG. 3 shows a programming method when the controllers 121 and 210 include the buffer sections 125 and 211.

Referring to FIG. 5, if it is determined that program data are input from the system 110 along with a command for programming in step S501, the controllers 121 and 210 store the input data in the buffer sections 122 and 220 in step S503. The method of storing the data in the buffer sections 122 and 210 is identical to that of programming data in a typical SLC or a 2-bit MLC.

The input data may be stored in the buffer sections 122 and 220 according to the step S503. If it is determined that the input data exceed the capacity of the buffer sections 122 and 220 in step S505, the data are stored in the controller buffers 125 and 211 in step S507.

Thereafter, if it is determined that the system 110 is in an idle state or a less busy time state for a specific period of time in step S509, the controllers 121 and 210 move the data stored in the butler sections 122 and 220 or the controller buffers 125 and 211, to the MLC section 123.

In other words, if it is determined that the system 110 is in an idle state or a less busy time state for a specific period of time in step S509, the controllers 121 and 210 first determine whether any data are stored in the controller buffers 125 and 211 in step S511.

If, as a result of the determination in step S511, it is determined that data are stored in the controller buffers 125 and 211, the controllers 121 and 210 primarily move the data, stored in the controller buffers 125 and 211, to the MLC section 123 or the MLC 230 in step S513.

However, if, as a result of the determination in step S511, it is determined that data are not stored in the controller buffers 125 and 211, the controllers 121 and 210 read the data stored in the buffer sections 122 and 220 and store the read data in the controller buffers 125 and 211 in steps S515 and S517.

After the data stored in the controller buffers 125 and 211 are all stored in the MLC section 123 or the MLC 230 in step S513, the controllers 121 and 210 read data stored in the buffer sections 122 and 220 in step S515. The data read from the buffer sections 122 and 220 are temporarily stored in the controller buffers 125 and 211 of the controllers 121 and 210 in step S517.

The data moved to the controller buffers 125 and 211 in step S515 are again stored in the MLC section 123 or the MLC 230 in step S519. At this time, the data stored in the controller buffers 125 and 211 in step S513 or S519 are stored in the MLC section 123 or the MLC 230, a function of deleting data stored in the controller buffers 125 and 211 may be added.

The MLC section 123 or the MLC 230 is a MLC capable of storing 3-bit or more data and has a longer programming time than that of the buffer sections 121 and 220.

Although the present invention has been described in connection with a number of the illustrative embodiments, it should be understood that numerous modifications and changes could be devised by those skilled in the art that will fall within the spirit and scope of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A multi-chip package device, comprising:
a plurality of memory devices each including a plurality of Multi-Level Cells (MLCs),
wherein some of the memory devices are set and operated as buffer sections in response to a control signal from a controller which comprises storage means for temporarily storing data.

2. The multi-chip package device of claim 1, wherein each of the plurality of memory devices comprises:
the buffer section that is set in response to the control signal from the controller and configured to temporarily store program data; and
Multi-Level Cell (MLC) array section comprising the MLCs in which data stored in the buffer section are stored in response to the control signal from the controller and plural bits are stored.

3. The multi-chip package device of claim 2, wherein the buffer section operates as a Single Level Cell (SLC) or a MLC for storing 2-bit data.

4. The multi-chip package device of claim 2, wherein the MLC cell array section stores 3-bit data or more.

5. The multi-chip package device of claim 2, wherein the controller controls input data to be temporarily stored in the buffer section and controls the data of the buffer section to be stored in the MLC array section.

6. The multi-chip package device of claim 5, wherein input data exceeding a capacity of the buffer section are stored in the storage means of the controller.

7. The multi-chip package device of claim 2, wherein the data stored in the storage means of the controller are primarily stored in the MLC array section.

8. The multi-chip package device of claim 2, wherein the controller controls the data, stored in the buffer section, to be moved to the storage means of the controller and controls the data, moved to the storage means of the controller, to be stored in the MLC array section.

* * * * *